United States Patent
Lin et al.

(10) Patent No.: US 9,905,549 B1
(45) Date of Patent: Feb. 27, 2018

(54) SEMICONDUCTOR APPARATUS AND METHOD FOR PREPARING THE SAME

(71) Applicant: NANYA TECHNOLOGY CORPORATION, Taoyuan (TW)

(72) Inventors: Po-Chun Lin, Changhua (TW); Chin-Lung Chu, Taoyuan (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/434,664

(22) Filed: Feb. 16, 2017

(51) Int. Cl.
*H01L 25/00* (2006.01)
*H01L 25/18* (2006.01)
(Continued)

(52) U.S. Cl.
CPC .......... *H01L 25/18* (2013.01); *H01L 21/486* (2013.01); *H01L 21/4853* (2013.01); *H01L 21/565* (2013.01); *H01L 21/568* (2013.01); *H01L 23/3128* (2013.01); *H01L 23/481* (2013.01); *H01L 23/49838* (2013.01); *H01L 24/17* (2013.01); *H01L 24/81* (2013.01); *H01L 25/50* (2013.01); *H01L 25/0657* (2013.01); *H01L 2224/16145* (2013.01); *H01L 2224/81005* (2013.01); *H01L 2225/06513* (2013.01); *H01L 2225/06541* (2013.01); *H01L 2225/06548* (2013.01); *H01L 2225/06586* (2013.01); *H01L 2924/0105* (2013.01); *H01L 2924/01013* (2013.01); *H01L 2924/01022* (2013.01); *H01L 2924/01023* (2013.01); *H01L 2924/01028* (2013.01); *H01L 2924/01029* (2013.01); *H01L 2924/01046* (2013.01); *H01L 2924/01047* (2013.01); *H01L 2924/01074* (2013.01); *H01L 2924/01079* (2013.01); *H01L 2924/01082* (2013.01); *H01L 2924/0665* (2013.01); *H01L 2924/1431* (2013.01); *H01L 2924/1432* (2013.01); *H01L 2924/1434* (2013.01); *H01L 2924/1436* (2013.01);
(Continued)

(58) Field of Classification Search
CPC ....................................................... H01L 25/18
See application file for complete search history.

(56) References Cited

U.S. PATENT DOCUMENTS

2012/0025362 A1    2/2012  Chandrasekaran et al.
2014/0057391 A1*   2/2014  Lin .................. H01L 21/56
                                                         438/107

* cited by examiner

*Primary Examiner* — William Harriston
(74) *Attorney, Agent, or Firm* — Muncy, Geissler, Olds & Lowe, P.C.

(57) ABSTRACT

The present disclosure provides a semiconductor apparatus having a plurality of semiconductor dies stacked in a face-to-face manner and a method for preparing the same. By stacking dies having different functions vertically in a face-to-face manner, a face-to-face communication is implemented between the dies having different functions. In addition, stacking the dies having different functions vertically in a face-to-face manner reduces the occupied area of the semiconductor apparatus, as compared to a semiconductor apparatus with dies having different functions arranged in a laterally adjacent manner. Furthermore, the signal path of the dies having different functions vertically stacked in the face-to-face manner is shorter than the signal path of the dies having different functions arranged in a laterally adjacent manner; consequently, the dies having different functions vertically stacked in the face-to-face manner of the present disclosure can be applied to high-speed electronic devices.

17 Claims, 8 Drawing Sheets

(51) Int. Cl.
*H01L 23/00* (2006.01)
*H01L 23/31* (2006.01)
*H01L 23/48* (2006.01)
*H01L 23/498* (2006.01)
*H01L 21/56* (2006.01)
*H01L 21/48* (2006.01)
H01L 25/065 (2006.01)

(52) U.S. Cl.
CPC ............... *H01L 2924/15311* (2013.01); *H01L 2924/186* (2013.01); *H01L 2924/40251* (2013.01)

SEMICONDUCTOR APPARATUS AND METHOD FOR PREPARING THE SAME

TECHNICAL FIELD

The present disclosure relates to a semiconductor apparatus and a method for preparing the same, and particularly relates to a semiconductor apparatus having a plurality of semiconductor dies stacked in a face-to-face manner and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor is devices. Numerous manufacturing steps are undertaken in the production of such semiconductor packages.

However, the manufacturing of semiconductor devices in a miniaturized scale is becoming more complicated. Any increase in the complexity of manufacturing a semiconductor device may cause deficiencies such as poor electrical interconnection, development of cracks, or delamination of components. As such, there are many challenges for modifying the structure and manufacture of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor apparatus, comprising: a semiconductor logic die having a first active surface and an internal conductive element extending from the first active surface to a back surface of the semiconductor logic die; a semiconductor memory die stacked onto the semiconductor logic die, wherein the first active surface of the semiconductor logic die faces a second active surface of the semiconductor memory die; and a bump structure electrically connecting a first terminal on the first active surface to a second terminal on the second active surface.

In some embodiments, the semiconductor apparatus further comprises a molding member encapsulating the semiconductor logic die and the semiconductor memory die.

In some embodiments, the semiconductor apparatus further comprises a conductive plug penetrating the molding member.

In some embodiments, the conductive plug vertically penetrates the molding member.

In some embodiments, the semiconductor apparatus further comprises an object, and the back surface of the semiconductor logic die is attached to the object.

In some embodiments, the object comprises a redistribution layer.

In some embodiments, the semiconductor logic die comprises a substrate and an electrical interconnect, and the internal conductive element comprises a conductive plug penetrating the substrate.

In some embodiments, the conductive plug vertically penetrates the substrate.

In some embodiments, the semiconductor memory die is electrically connected to the semiconductor logic die substantially in the absence of a bonding wire between the semiconductor memory die and the semiconductor logic die.

Another aspect of the present disclosure provides a method for preparing a semiconductor apparatus, comprising: attaching a semiconductor memory die to a carrier substrate; stacking a semiconductor logic die onto the semiconductor memory die in a face-to-face manner; forming a molding member over the carrier substrate, wherein the molding member surrounds the semiconductor memory die and the semiconductor logic die; and removing the carrier substrate.

In some embodiments, the method further comprises: forming an object over a back surface of the semiconductor memory die, wherein the object implements a lateral signal path of the semiconductor apparatus.

In some embodiments, the forming of the object comprises forming a redistribution layer.

In some embodiments, the method further comprises forming a plurality of conductive bumps over the object.

In some embodiments, the method further comprises forming a conductive plug over the carrier substrate before forming the molding member over the carrier substrate.

In some embodiments, the semiconductor logic die has a first active surface, the semiconductor memory die has a second active surface, and the semiconductor logic die is attached to the semiconductor memory die such that the first active surface of the semiconductor logic die faces the second active surface of the semiconductor memory die.

In some embodiments, the semiconductor logic die has an internal conductive element extending from the first active surface to a back surface of the semiconductor logic die.

In some embodiments, the semiconductor memory die is electrically connected to the semiconductor logic die substantially in the absence of a bonding wire between the semiconductor memory die and the semiconductor logic die.

The present disclosure is directed to a semiconductor apparatus having a plurality of semiconductor dies stacked in a face-to-face manner and a method for preparing the same. By stacking dies having different functions vertically in a face-to-face manner, a face-to-face communication is implemented between the dies of different functions. In addition, stacking dies having different functions vertically in a face-to-face manner reduces the occupied area of the semiconductor apparatus, as compared to a semiconductor apparatus with dies of different functions arranged in a laterally adjacent manner. Furthermore, the signal path of the dies of different functions vertically stacked in the face-to-face manner is shorter than the signal path of the dies of different functions arranged in a laterally adjacent manner; consequently, the dies of different functions vertically stacked in the face-to-face manner of the present disclosure can be applied to high-speed electronic devices.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor apparatus having a plurality of semiconductor dies stacked in a face-to-face manner and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
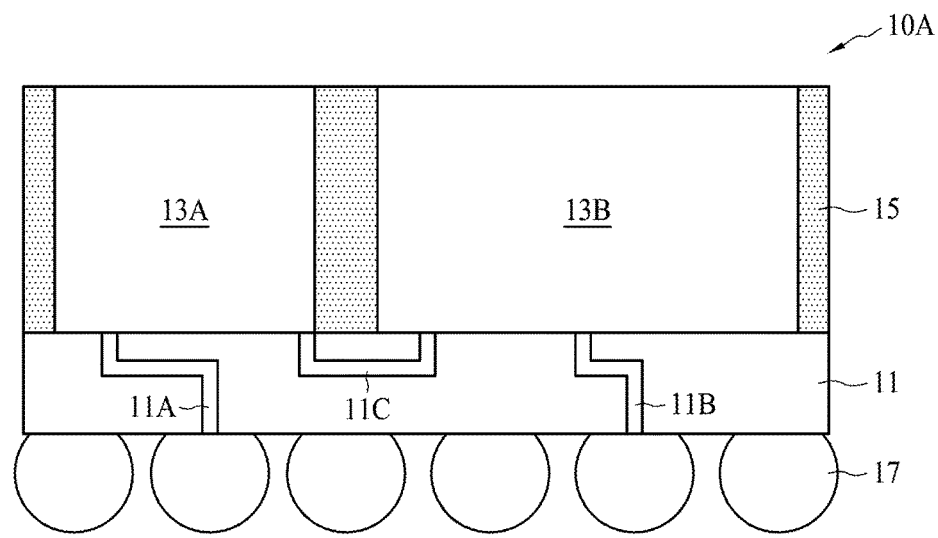
FIG. 1 is a cross-sectional view of a semiconductor apparatus in accordance with a comparative embodiment of the present disclosure.

FIG. 1 is a cross-sectional view of a semiconductor apparatus 10A in accordance with a comparative embodiment of the present disclosure. The semiconductor apparatus 10A includes a redistribution layer 11, a semiconductor memory die 13A and a semiconductor logic die 13B disposed on the redistribution layer 11, a molding member 15 encapsulating the semiconductor memory die 13A and the semiconductor logic die 13B on the redistribution layer 11, and a plurality of conductive bumps 17 attached to the redistribution layer 11. In some embodiments, the conductive bumps 17 are disposed on the bottom side of the redistribution layer 11, while the semiconductor memory die 13A and the semiconductor logic die 13B are disposed on the upper side of the redistribution layer 11.

In some embodiments, a vertical signal path of the semiconductor memory die 13A is implemented by a conductive line 11A in the redistribution layer 11 and the conductive bump 17, a vertical signal path of the semiconductor logic die 13B is implemented by a conductive line 11B in the redistribution layer 11 and the conductive bump 17, and a lateral signal path between the semiconductor memory die 13A and the semiconductor logic die 13B is implemented by a conductive line 11C in the redistribution layer 11 without using the conductive bump 17.

Figure 2:
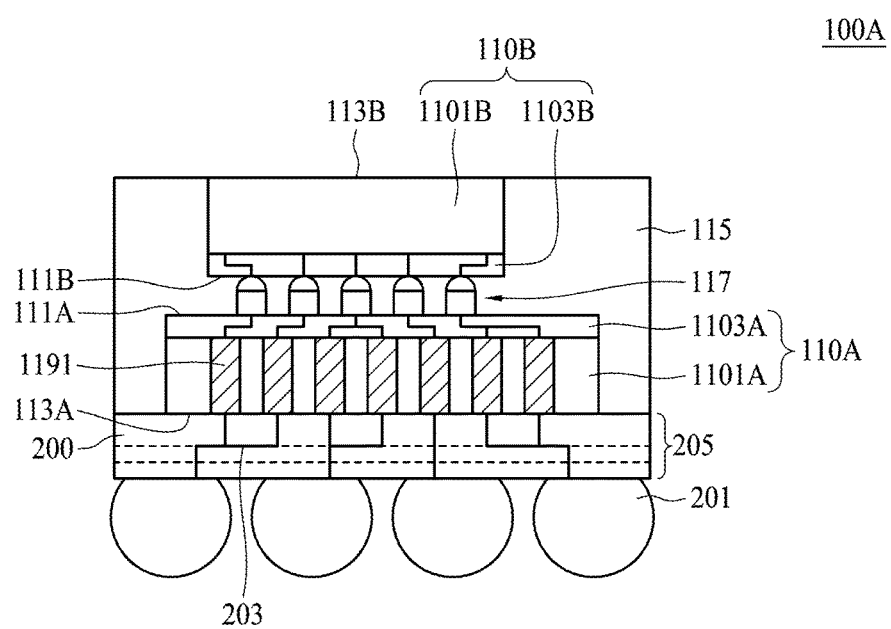
FIG. 2 is a cross-sectional view of a semiconductor apparatus in accordance with some embodiments of the present disclosure.
Figure 3:
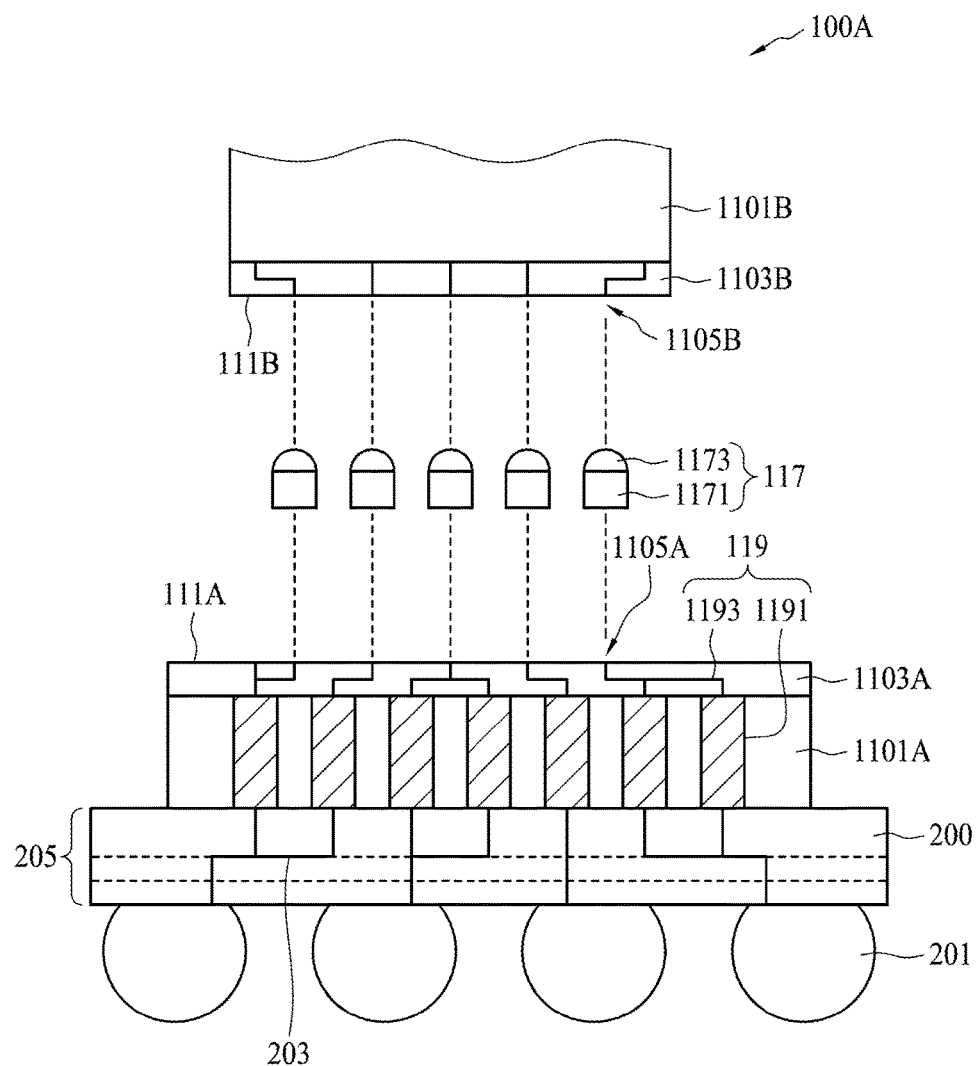
FIG. 3 is a schematic disassembled view of the semiconductor apparatus shown in FIG. 2.

FIG. 2 is a cross-sectional view of a semiconductor apparatus 100A in accordance with some embodiments of the present disclosure, and FIG. 3 is a schematic disassembled view of the semiconductor apparatus 100A shown in FIG. 2. In some embodiments, the semiconductor apparatus 100A comprises an object 200, a semiconductor logic die 110A attached to the object 200, a semiconductor memory die 110B attached to the semiconductor logic die 110A in a face-to-face manner, and a molding member 115 encapsulating the semiconductor logic die 110A and the semiconductor memory die 110B.

In some embodiments, the semiconductor logic die 110A comprises a substrate 1101A and an electrical interconnect 1103A on the substrate 1101A, the semiconductor memory die 110B comprises a substrate 1101B and an electrical interconnect 1103B on the substrate 1101B. In some embodiments, the semiconductor logic die 110A has a first active surface 111A (the front surface of the electrical interconnect 1103A) and a first back surface 113A, and the semiconductor memory die 110B has a second active surface 111B (the front surface of the electrical interconnect 1103B) and second back surface 113B. In some embodiments, in the face-to-face stacking, the first active surface 111A of the semiconductor logic die 110A faces the second active surface 111B of the semiconductor memory die 110B.

In some embodiments, the substrate 1101A and the substrate 1101B can be silicon substrates, semiconductor-on-insulator (SOI) substrates, or any construction comprising semiconductor materials; and the electrical interconnect 1103A and the electrical interconnect 1103B comprise dielectric material and conductive elements made of, for example, Ti, Al, Ni, nickel vanadium (NiV), Cu, or a Cu alloy. In some embodiments, the molding member 115 can be a single-layer film or a composite stack. In some embodiments, the molding member 115 includes various materials, such as molding compound, molding underfill, epoxy, resin, or the like. In some embodiments, the molding member 115 has a high thermal conductivity, a low moisture absorption rate and a high flexural strength.

In some embodiments, the semiconductor logic die 110A includes integrated circuits (IC) or semiconductor components such as transistors, capacitors, resistors, diodes, photodiodes, fuses, and the like configured to perform one or more functions, wherein the IC and semiconductor components are not shown for clarity in this illustration. In some embodiments, the semiconductor memory die 110B is a memory chip such as a DRAM (Dynamic Random Access Memory) chip, the semiconductor logic die 110A is a logic chip such as a CPU (Central Processing Unit)/GPU (Graphics Processing Unit) chip. It is well known that a memory chip comprises address input terminals for addressing memory cells, data input/output terminals for inputting and outputting data to and from the memory cells, and power supply terminals.

In some embodiments, the semiconductor logic die 110A comprises a plurality of first terminals 1105A on the first active surface 111A, the semiconductor memory die 110B comprises a plurality of second terminals 1105B on the second active surface 111B, and the first terminals 1105A are electrically connected to the second terminals via an electrical bump structure 117 including a bump 1171 and a solder 1173, substantially in the absence of a bonding wire between the semiconductor memory die 110B and the semiconductor logic die 110A.

In some embodiments, the semiconductor logic die 110A has a plurality of internal conductive elements 119 extending from the first active surface 111A to the first back surface 113A of the semiconductor logic die 110A. In some embodiments, the internal conductive element 119 comprises a conductive plug 1191 (a through silicon via) vertically penetrating the substrate 1101A and a wire 1193 in the electrical interconnect 1103A.

In some embodiments, the object 200 is a redistribution layer. In some embodiments, the redistribution layer comprises a dielectric stack 205 and several conductive lines 203 disposed in the dielectric stack 205. The conductive line 203 has a first conductive terminal on an upper side for electrically connecting to the conductive plug 1191, and a second conductive terminal on a bottom side for electrically connecting to a conductive bump 201. The conductive line 203 is also used to form an electrical connection among the conductive plugs 1191. In some embodiments, the conductive line 203 is made of copper, gold, silver, nickel, solder, tin, lead, tungsten, aluminum, titanium, palladium or alloys thereof.

In some embodiments, by stacking dies having different functions (e.g., semiconductor logic die 110A and semiconductor memory die 110B) vertically in a face-to-face manner, a face-to-face communication is implemented between the dies of different functions. In addition, stacking dies having different functions (semiconductor logic die 110A and semiconductor memory die 110B) vertically in a face-to-face manner reduces the occupied area of the semiconductor apparatus 100A, as compared to a semiconductor apparatus 10A with dies having different functions (semiconductor memory die 13A and semiconductor logic die 13B) arranged in a laterally adjacent manner. Furthermore, the signal path of the dies having different functions stacked vertically in the face-to-face manner is obviously shorter than the signal path of the dies having different functions arranged in a laterally adjacent manner; consequently, the dies having different functions vertically stacked in the face-to-face manner of the present disclosure can be applied to high-speed electronic devices.

Figure 4:
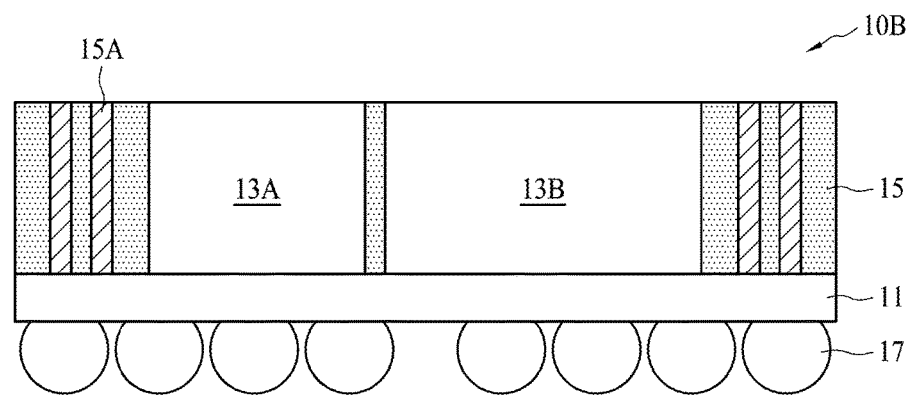
FIG. 4 is a cross-sectional view of a semiconductor apparatus in accordance with a comparative embodiment of the present disclosure.

FIG. 4 is a cross-sectional view of a semiconductor apparatus 10B in accordance with a comparative embodiment of the present disclosure. The semiconductor apparatus 10B shown in FIG. 4 is substantially the same as the semiconductor apparatus 10A shown in FIG. 1, except for the design of the through molding via. In FIG. 1, there is not a through molding via in the molding member 15 of the semiconductor apparatus 10A, whereas in FIG. 4 several conductive plugs (through molding via) 15A are disposed in the molding member 115 of the semiconductor apparatus 10B in FIG. 4. In some embodiments, the conductive plugs 115A penetrate the molding member 115 to form a vertical signal path between the object 200 on the bottom side and another object such as a circuit substrate at the upper side of the conductive plugs 115A.

Figure 5:
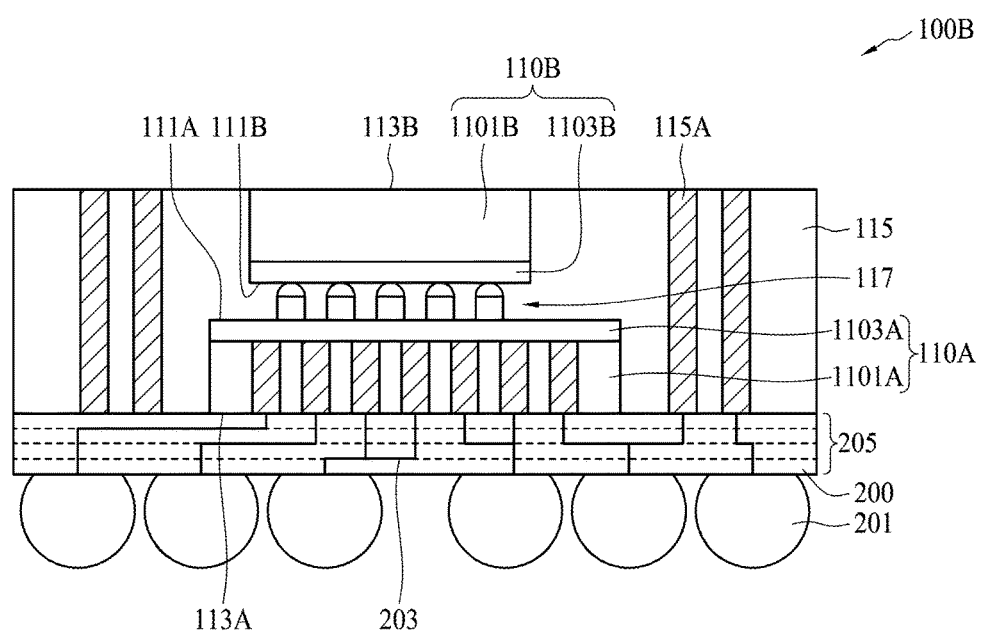
FIG. 5 is a cross-sectional view of a semiconductor apparatus in accordance with some embodiments of the present disclosure.

FIG. 5 is a cross-sectional view of a semiconductor apparatus 100B in accordance with some embodiments of the present disclosure. The semiconductor apparatus 100B shown in FIG. 5 is substantially the same as the semiconductor apparatus 100A shown in FIG. 2, except for the design of the through molding via. In FIG. 2, there is not a through molding via in the molding member 115 of the semiconductor apparatus 100A, whereas in FIG. 5 several conductive plugs (through molding via) 115A are disposed in the molding member 115 of the semiconductor apparatus 100B. In some embodiments, the conductive plugs 115A penetrate the molding member 115 to form a vertical signal path between the object 200 on the bottom side and another object such as a circuit substrate at the upper side of the conductive plugs 115A.

Figure 6:
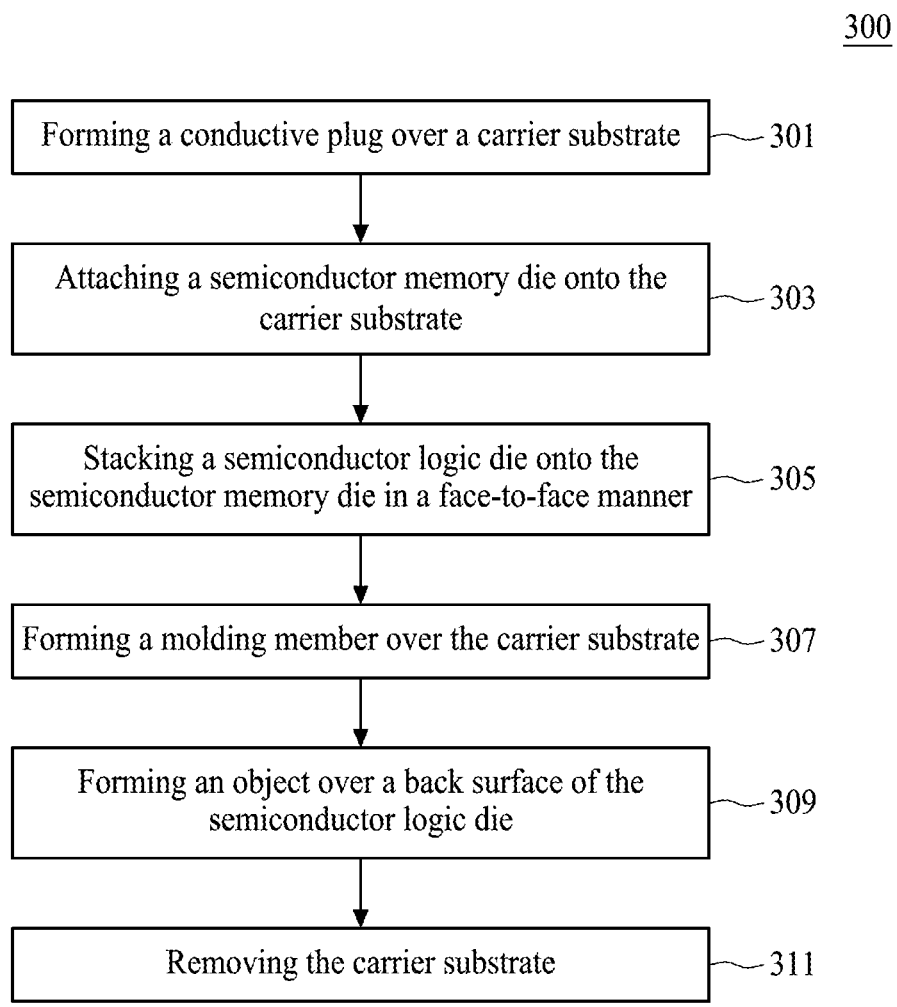
FIG. 6 is a flow chart of a method for preparing a semiconductor apparatus in accordance with some embodiments of the present disclosure.

In the present disclosure, a method for preparing a semiconductor apparatus is also disclosed. In some embodiments, the semiconductor apparatus can be formed by a method 300 as illustrated in FIG. 6. The method 300 includes a number of operations and the description and illustration are not deemed as a limitation of the sequence of the operations. The method 300 includes a number of steps (301, 303, 305, 307, 309, and 311).

Figure 7:
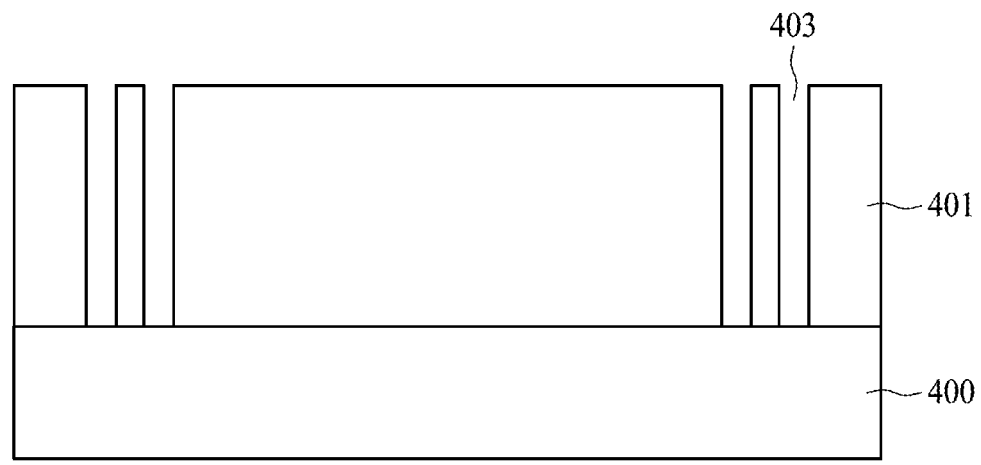
FIGS. 7 to 13 are schematic views of a process for preparing the semiconductor apparatus by the method of FIG. 6 in accordance with some embodiments of the present disclosure.
Figure 8:
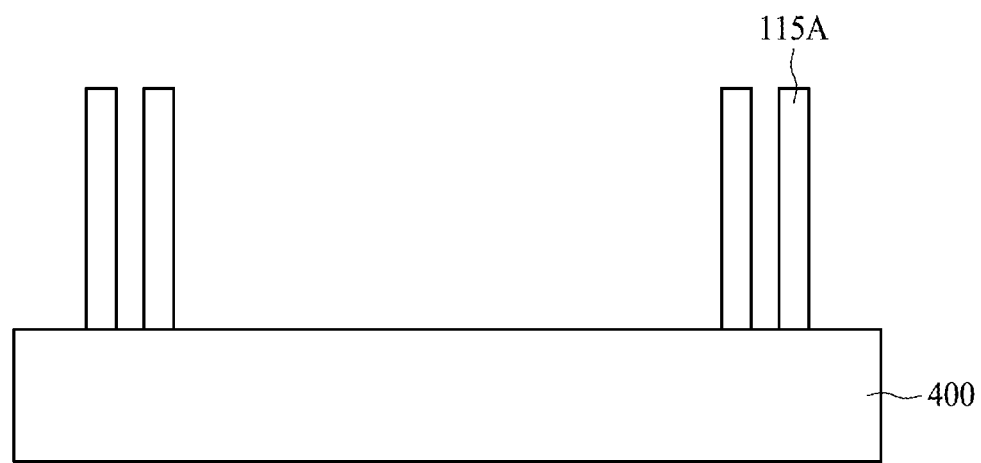

FIGS. 7 to 13 are schematic views of a process for preparing the semiconductor apparatus by the method of FIG. 6 in accordance with some embodiments of the present disclosure. In step 301, a conductive plug 115A is formed over a carrier substrate 400 as shown in FIGS. 7 and 8. In some embodiments, the forming of the conductive plug 115A includes forming a mask layer 401 having an opening 403 over the carrier substrate 400 as shown in FIG. 7, filling the opening 403 with conductive material, and then removing the mask layer 401 from the carrier substrate 400 to form the conductive plug 115A over the carrier substrate 400 as shown in FIG. 8.

Figure 9:
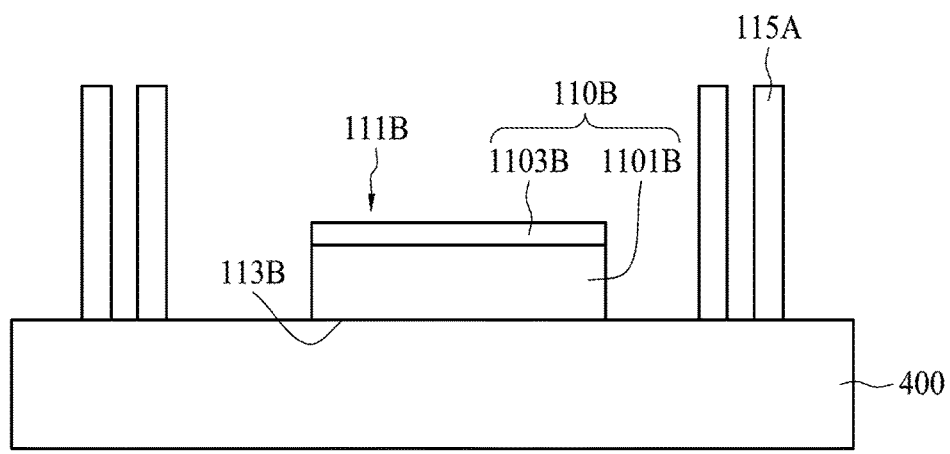

In step 303, a semiconductor memory die 110B is attached to the carrier substrate 400, as shown in FIG. 9. In some embodiments, the semiconductor memory die 110B comprises a substrate 1101B and an electrical interconnect 1103B on the substrate 1101B, wherein the front surface of the electrical interconnect 1103B (an active surface 111B of the semiconductor memory die 110B) faces upward, and the back surface of the substrate 1101B (the back surface 113B of the semiconductor memory die 110B) is attached to the carrier substrate 400.

Figure 10:
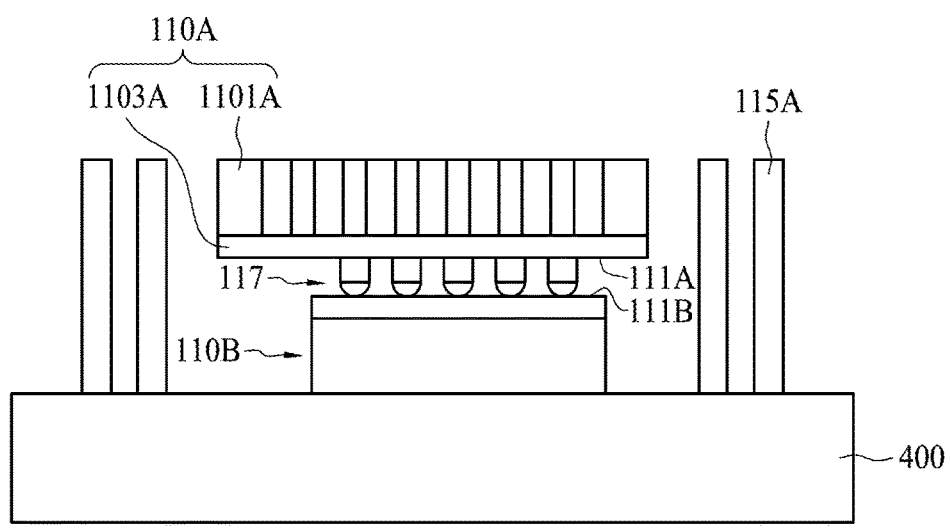

In step 305, a semiconductor logic die 110A with a bump structure 117 is stacked onto the semiconductor memory die 110B in a face-to-face manner, with the bump structure 117 intervening between the semiconductor logic die 110A and the semiconductor memory die 110B, as shown in FIG. 10. In some embodiments, the semiconductor logic die 110A comprises a substrate 1101A and an electrical interconnect 1103A on the substrate 1101A, wherein the front surface of the electrical interconnect 1103A (an active surface 111A of the semiconductor logic die 110A) faces downward such that the active surface 111A of the semiconductor logic die 110A faces the active surface 111B of the semiconductor memory die 110B, i.e., a face-to-face stacking.

Figure 11:
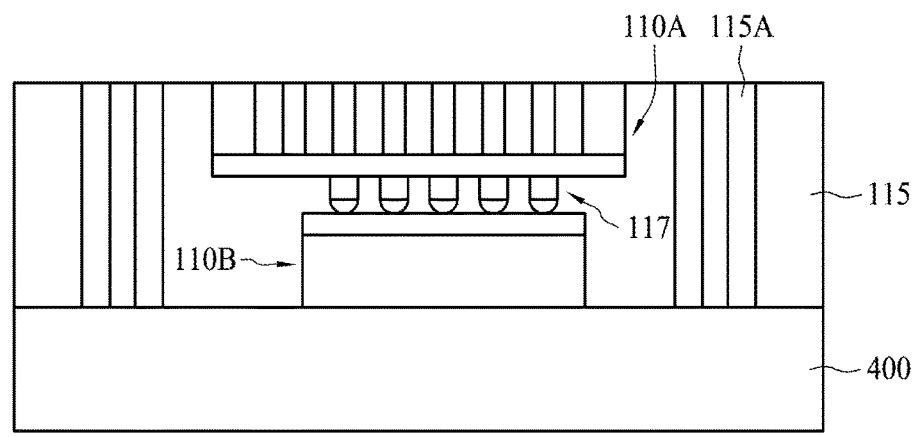

In step 307, a molding member 115 is formed over the carrier substrate 400 as shown in FIG. 11. In some embodiments, the conductive plug 115A, the semiconductor logic die 110A and the semiconductor memory die 110B are formed or attached over the carrier substrate 400 before the molding member 115 is formed over the carrier substrate 400; therefore, the molding member 115 surrounds the conductive plug 115A, the semiconductor logic die 110A and the semiconductor memory die 110B.

Figure 12:
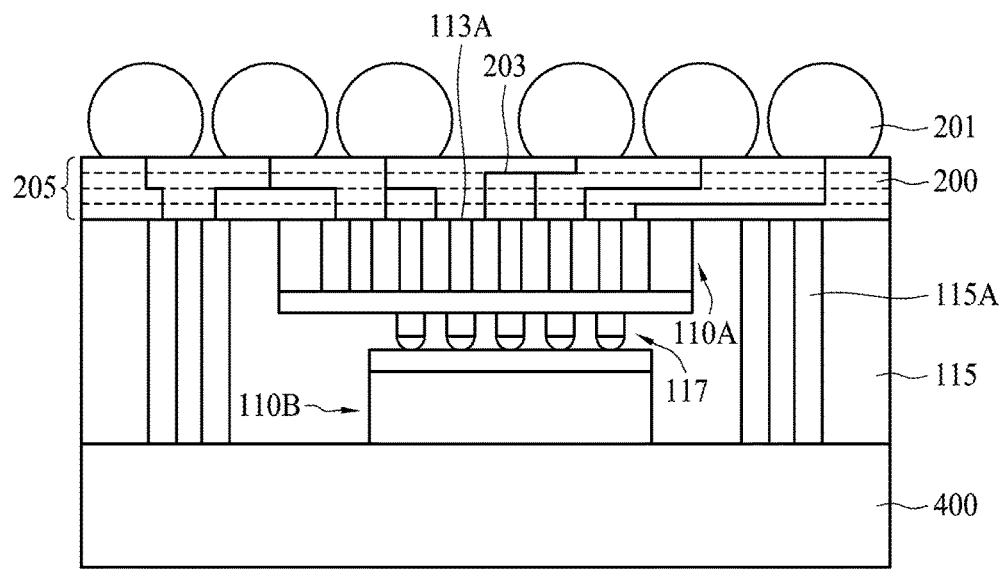
Figure 13:
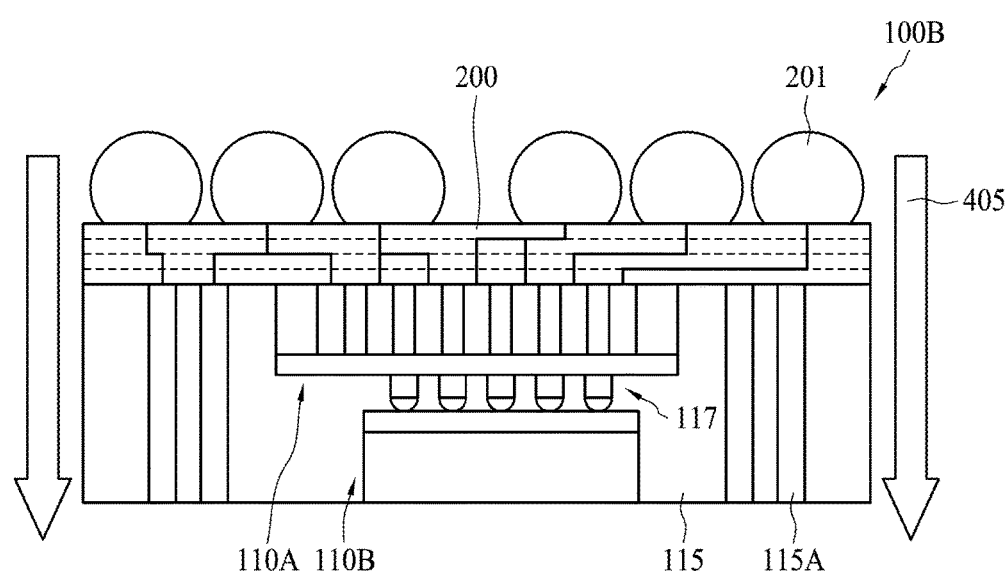

In step 309, an object 200 such as a redistribution layer is formed over a back surface 113A of the semiconductor logic die 110A, as shown in FIG. 12. In some embodiments, the redistribution layer is formed by deposition, lithographic and etching processes. In addition, several conductive bumps 201 are formed over the redistribution layer. In some embodiments, the redistribution layer is formed after the formation of the molding member 115.

In step 311, the carrier substrate 400 is removed, and a singulation process is performed to cut the semiconductor apparatus 100B into a separated semiconductor package. In some embodiments, the singulation process is performed with a die cutting or a singulation tool 405 such as a mechanical or laser saw is used to cut through the substrate between individual chips or dies. In some embodiments, the laser sawing uses an Argon (Ar) based ion laser beam tool.

The present disclosure is directed to a semiconductor apparatus having a plurality of semiconductor dies stacked in a face-to-face manner and a method for preparing the same. By stacking dies having different functions vertically in a face-to-face manner, a face-to-face communication is implemented between the dies having different functions. In addition, stacking dies having different functions vertically in a face-to-face manner reduces the occupied area of the semiconductor apparatus, as compared to a semiconductor apparatus with laterally adjacent dies having different functions arranged in a laterally adjacent manner. Furthermore, the signal path of the dies having different functions vertically stacked in the face-to-face manner is shorter than the signal path of the dies having different functions arranged in a laterally adjacent manner; consequently, the dies having different functions vertically stacked in the face-to-face manner of the present disclosure can be applied to high-speed electronic devices.

One embodiment of the present disclosure provides a semiconductor apparatus including a semiconductor logic die having a first active surface and an internal conductive element extending from the first active surface to a back surface of the semiconductor logic die; a semiconductor memory die stacked onto the semiconductor logic die, wherein the first active surface of the semiconductor logic die faces a second active surface of the semiconductor memory die; and a bump structure electrically connecting a first terminal on the first active surface to a second terminal on the second active surface.

Another embodiment of the present disclosure provides a method for preparing a semiconductor apparatus, including: attaching a semiconductor memory die to a carrier substrate; stacking a semiconductor logic die onto the semiconductor memory die in a face-to-face manner; forming a molding member over the carrier substrate, wherein the molding member surrounds the semiconductor memory die and the semiconductor logic die; and removing the carrier substrate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor apparatus, comprising:
a semiconductor logic die having a first active surface and an internal conductive element extending from the first active surface to a back surface of the semiconductor logic die;
a semiconductor memory die stacked onto the semiconductor logic die, wherein the first active surface of the semiconductor logic die faces a second active surface of the semiconductor memory die;
a bump structure electrically connecting a first terminal on the first active surface to a second terminal on the second active surface; and
a conductive plug penetrating the molding member.

2. The semiconductor apparatus of claim 1, further comprising a molding member encapsulating the semiconductor logic die and the semiconductor memory die.

3. The semiconductor apparatus of claim 1, wherein the conductive plug vertically penetrates the molding member.

4. The semiconductor apparatus of claim 1, further comprising an object, wherein the back surface of the semiconductor logic die is attached to the object.

5. The semiconductor apparatus of claim 4, wherein the object comprises a redistribution layer.

6. The semiconductor apparatus of claim 1, wherein the semiconductor logic die comprises a substrate and an electrical interconnect, and the internal conductive element comprises a conductive plug penetrating the substrate.

7. The semiconductor apparatus of claim 6, wherein the conductive plug vertically penetrates the substrate.

8. The semiconductor apparatus of claim 1, wherein the semiconductor memory die is electrically connected to the semiconductor logic die substantially in the absence of a bonding wire between the semiconductor memory die and the semiconductor logic die.

9. The semiconductor apparatus of claim 1, wherein the semiconductor logic die includes a first electrical interconnect on an upper portion of the semiconductor logic die, the semiconductor memory die includes a second electrical interconnect on a lower portion of the semiconductor memory die, the first active surface is an upper surface of the first electrical interconnect, and the second active surface is a lower surface of the second electrical interconnect.

10. A method for preparing a semiconductor apparatus, comprising:

attaching a semiconductor memory die to a carrier substrate;

stacking a semiconductor logic die onto the semiconductor memory die in a face-to-face manner;

forming a molding member over the carrier substrate, wherein the molding member surrounds the semiconductor memory die and the semiconductor logic die;

removing the carrier substrate; and forming a conductive plug over the carrier substrate before forming the molding member over the carrier substrate.

11. The method for preparing a semiconductor apparatus of claim 10, further comprising: forming an object over a back surface of the semiconductor memory die, wherein the object implements a lateral signal path of the semiconductor apparatus.

12. The method for preparing a semiconductor apparatus of claim 10, wherein the forming of the object comprises forming a redistribution layer.

13. The method for preparing a semiconductor apparatus of claim 10, further comprising: forming a plurality of conductive bumps over the object.

14. The method for preparing a semiconductor apparatus of claim 10, wherein the semiconductor logic die has a first active surface, the semiconductor memory die has a second active surface, and the semiconductor logic die is attached to the semiconductor memory die such that the first active surface of the semiconductor logic die faces the second active surface of the semiconductor memory die.

15. The method for preparing a semiconductor apparatus of claim 14, wherein the semiconductor logic die has an internal conductive element extending from the first active surface to a back surface of the semiconductor logic die.

16. The method for preparing a semiconductor apparatus of claim 10, wherein the semiconductor memory die is electrically connected to the semiconductor logic die substantially in the absence of a bonding wire between the semiconductor memory die and the semiconductor logic die.

17. The method for preparing a semiconductor apparatus of claim 10, wherein the semiconductor logic die includes a first electrical interconnect on an upper portion of the semiconductor logic die, the semiconductor memory die includes a second electrical interconnect on a lower portion of the semiconductor memory die, the first active surface is an upper surface of the first electrical interconnect, and the second active surface is a lower surface of the second electrical interconnect.

* * * * *